(12) United States Patent
Foster

(10) Patent No.: US 6,818,973 B1
(45) Date of Patent: Nov. 16, 2004

(54) EXPOSED LEAD QFP PACKAGE FABRICATED THROUGH THE USE OF A PARTIAL SAW PROCESS

(75) Inventor: Donald C. Foster, Mesa, AZ (US)

(73) Assignee: Amkor Technology, Inc., Chandler, AZ (US)

(*) Notice: Subject to any disclaimer, the term of this patent is extended or adjusted under 35 U.S.C. 154(b) by 19 days.

(21) Appl. No.: 10/237,293

(22) Filed: Sep. 9, 2002

(51) Int. Cl.[7] .................................................. H01L 23/495
(52) U.S. Cl. ..................... 257/676; 257/787; 257/692; 257/670; 257/668
(58) Field of Search ................. 257/787, 784, 257/668, 670, 692, 676

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,189,342 A | 2/1980 | Kock |
| 4,289,922 A | 9/1981 | Devlin |
| 4,301,464 A | 11/1981 | Otsuki et al. |
| 4,417,266 A | 11/1983 | Grabbe |
| 4,530,152 A | 7/1985 | Roche et al. |
| 4,707,724 A | 11/1987 | Suzuki et al. |
| 4,737,839 A | 4/1988 | Burt |
| 4,756,080 A | 7/1988 | Thorp, Jr. et al. |
| 4,812,896 A | 3/1989 | Rothgery et al. |
| 4,862,245 A | 8/1989 | Pashby et al. |
| 4,907,067 A | 3/1990 | Derryberry |
| 4,935,803 A | 6/1990 | Kalfus et al. |
| 4,987,475 A | 1/1991 | Schlesinger et al. |
| 5,029,386 A | 7/1991 | Chao et al. |
| 5,041,902 A | 8/1991 | McShane |
| 5,065,223 A | 11/1991 | Matsuki et al. |
| 5,070,039 A | 12/1991 | Johnson et al. |
| 5,087,961 A | 2/1992 | Long et al. |
| 5,096,852 A | 3/1992 | Hobson |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |

(List continued on next page.)

FOREIGN PATENT DOCUMENTS

| | | |
|---|---|---|
| DE | 19734794 A1 | 8/1997 |
| EP | 54021117 | 6/1979 |
| EP | 59050939 | 3/1984 |

(List continued on next page.)

OTHER PUBLICATIONS

JEDEC Solid State Product Outline, "Lead Header Family Surface Mounted (Peripheral Terminals)", 4 pages.

Mannion, P., "MOSFETs Break Out of the Shackles of Wirebonding", Electronic Design, vol. 47, #6 (Mar. 22, 1999).

Micro Electronics Packaging Handbook, 1989, edited by R. Tummata & E. Rymaszewski, published by Van Nostrand Reinhold, New York, NY.

Vishay Siliconix Press Release, http://www.siliconix.com/www/200/pr98/4430.html, Dec. 9, 1998, pp. 1–3.

Primary Examiner—Nathan J. Flynn
Assistant Examiner—Pershelle Greene
(74) Attorney, Agent, or Firm—Stetina Brunda Garred & Brucker

(57) ABSTRACT

A QFP exposed pad package which includes leads exposed within the bottom surface of the package body of the package in addition to those gull-wing leads protruding from the sides of the package body. Those leads exposed within the bottom surface of the package body are created through the utilization of a standard leadframe with additional lead features that are electrically isolated subsequent to a molding process through the use of a partial saw method.

30 Claims, 6 Drawing Sheets

U.S. PATENT DOCUMENTS

| | | |
|---|---|---|
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,294,897 A | 3/1994 | Notani et al. |
| 5,332,864 A | 7/1994 | Liang et al. |
| 5,336,931 A | 8/1994 | Juskey et al. |
| 5,343,076 A | 8/1994 | Katayama et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,454,905 A | 10/1995 | Fogelson |
| 5,474,958 A | 12/1995 | Djennas et al. |
| 5,508,556 A | 4/1996 | Lin |
| 5,517,056 A | 5/1996 | Bigler et al. |
| 5,521,429 A | 5/1996 | Aono et al. |
| 5,534,467 A | 7/1996 | Rostoker |
| 5,539,251 A | 7/1996 | Iverson et al. |
| 5,544,412 A | 8/1996 | Romero et al. |
| 5,545,923 A | 8/1996 | Barber |
| 5,581,122 A | 12/1996 | Chao et al. |
| 5,592,025 A | 1/1997 | Clark et al. |
| 5,594,274 A | 1/1997 | Suetaki |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,644,169 A | 7/1997 | Chun |
| 5,646,831 A | 7/1997 | Manteghi |
| 5,650,663 A | 7/1997 | Parthasaranthi |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,745,984 A | 5/1998 | Cole, Jr. et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,615 A | 10/1998 | Lee |
| 5,835,988 A | 11/1998 | Ishii |
| 5,844,306 A | 12/1998 | Fujita et al. |
| 5,859,471 A | 1/1999 | Kuraishi et al. |
| 5,866,939 A | 2/1999 | Shin et al. |
| 5,874,784 A | 2/1999 | Aoki et al. |
| 5,877,043 A | 3/1999 | Alcoe et al. |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,917,242 A | 6/1999 | Ball |
| 5,942,794 A | 8/1999 | Okumura et al. |
| 5,951,305 A | 9/1999 | Haba |
| 5,959,356 A | 9/1999 | Oh |
| 5,973,388 A | 10/1999 | Chew et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,013,947 A | 1/2000 | Lim |
| 6,018,189 A | 1/2000 | Mizuno |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,060,769 A | 5/2000 | Wark |
| 6,072,228 A | 6/2000 | Hinkle et al. |
| 6,087,722 A | 7/2000 | Lee et al. |
| 6,100,594 A | 8/2000 | Fukui et al. |
| 6,118,184 A | 9/2000 | Ishio et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,197,615 B1 | 3/2001 | Song et al. |
| 6,198,171 B1 | 3/2001 | Huang et al. |
| 6,201,186 B1 | 3/2001 | Daniels et al. |
| 6,208,020 B1 | 3/2001 | Minamio et al. |
| 6,218,731 B1 | 4/2001 | Huang et al. |
| 6,222,258 B1 | 4/2001 | Asano et al. |
| 6,225,146 B1 | 5/2001 | Yamaguchi et al. |
| 6,229,200 B1 | 5/2001 | Mclellan et al. |
| 6,239,384 B1 | 5/2001 | Smith et al. |
| 6,242,281 B1 | 6/2001 | Mclellan et al. |
| 6,256,200 B1 | 7/2001 | Lam et al. |
| 6,281,566 B1 | 8/2001 | Magni |
| 6,281,568 B1 | 8/2001 | Glenn et al. |
| 6,282,095 B1 | 8/2001 | Houghton et al. |
| 6,291,273 B1 | 9/2001 | Miyaki et al. |
| 6,294,100 B1 | 9/2001 | Fan et al. |
| 6,303,984 B1 | 10/2001 | Corisis |
| 6,316,838 B1 | 11/2001 | Ozawa et al. |
| 6,326,244 B1 | 12/2001 | Brooks et al. |
| 6,329,706 B1 * | 12/2001 | Nam .......................... 257/666 |
| 6,348,726 B1 | 2/2002 | Bayan |
| 6,355,502 B1 | 3/2002 | Kang et al. |
| 6,380,048 B1 | 4/2002 | Boon et al. |
| 6,384,472 B1 | 5/2002 | Huang |
| 6,444,499 B1 | 9/2002 | Swiss et al. |
| 6,452,279 B2 | 9/2002 | Shimoda |
| 6,464,121 B2 | 10/2002 | Reijnders |
| 2002/0011654 A1 | 1/2002 | Kimura |
| 2002/0027297 A1 * | 3/2002 | Ikenaga et al. ............. 257/784 |
| 2002/0163015 A1 * | 11/2002 | Lee et al. ................... 257/200 |
| 2003/0073265 A1 * | 4/2003 | Hu et al. .................... 438/123 |

FOREIGN PATENT DOCUMENTS

| | | |
|---|---|---|
| EP | 0720225 | 3/1996 |

| | | | | | | |
|---|---|---|---|---|---|---|
| EP | 0720234 | 3/1996 | | JP | 5166992 | 7/1993 |
| EP | 0794572 A2 | 10/1997 | | JP | 5283460 | 10/1993 |
| EP | 0936671 | 8/1999 | | JP | 692076 | 4/1994 |
| JP | 55163868 | 12/1980 | | JP | 7297344 | 11/1995 |
| JP | 5745959 | 3/1982 | | JP | 7312405 | 11/1995 |
| JP | 58160095 | 8/1983 | | JP | 864634 | 3/1996 |
| JP | 59208756 | 11/1984 | | JP | 8125066 | 5/1996 |
| JP | 59227143 | 12/1984 | | JP | 8306853 | 11/1996 |
| JP | 60116239 | 8/1985 | | JP | 98205 | 1/1997 |
| JP | 60195957 | 10/1985 | | JP | 98206 | 1/1997 |
| JP | 60231349 | 11/1985 | | JP | 98207 | 1/1997 |
| JP | 6139555 | 2/1986 | | JP | 992775 | 4/1997 |
| JP | 629639 | 1/1987 | | JP | 10256240 | 9/1998 |
| JP | 63205935 | 8/1988 | | KR | 941979 | 3/1994 |
| JP | 63233555 | 9/1988 | | KR | 199772358 | 11/1997 |
| JP | 63249345 | 10/1988 | | KR | 100220154 | 6/1999 |
| JP | 63316470 | 12/1988 | | WO | 9956316 | 11/1999 |
| JP | 64054749 | 3/1989 | | | | |
| JP | 1106456 | 4/1989 | | | | |
| JP | 4098864 | 3/1992 | | | | |

* cited by examiner

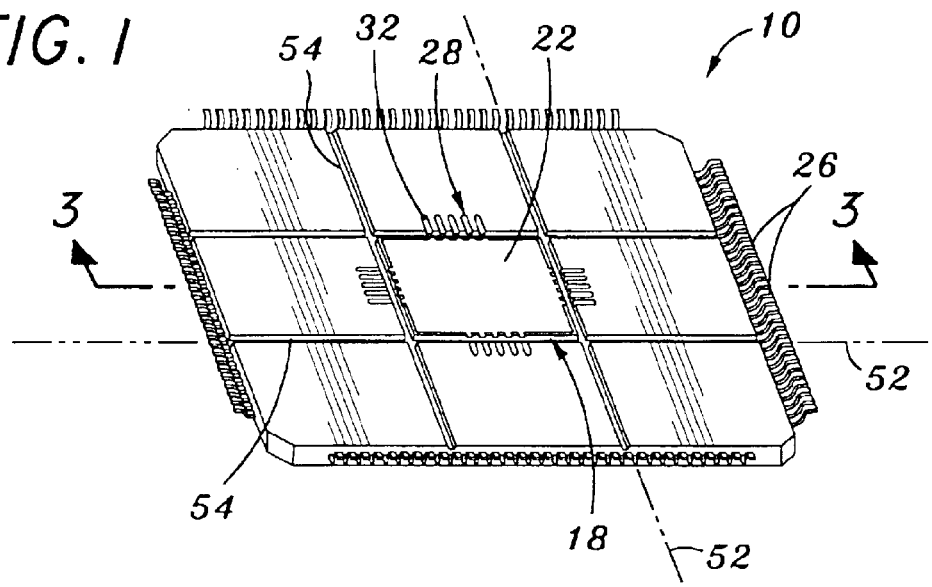
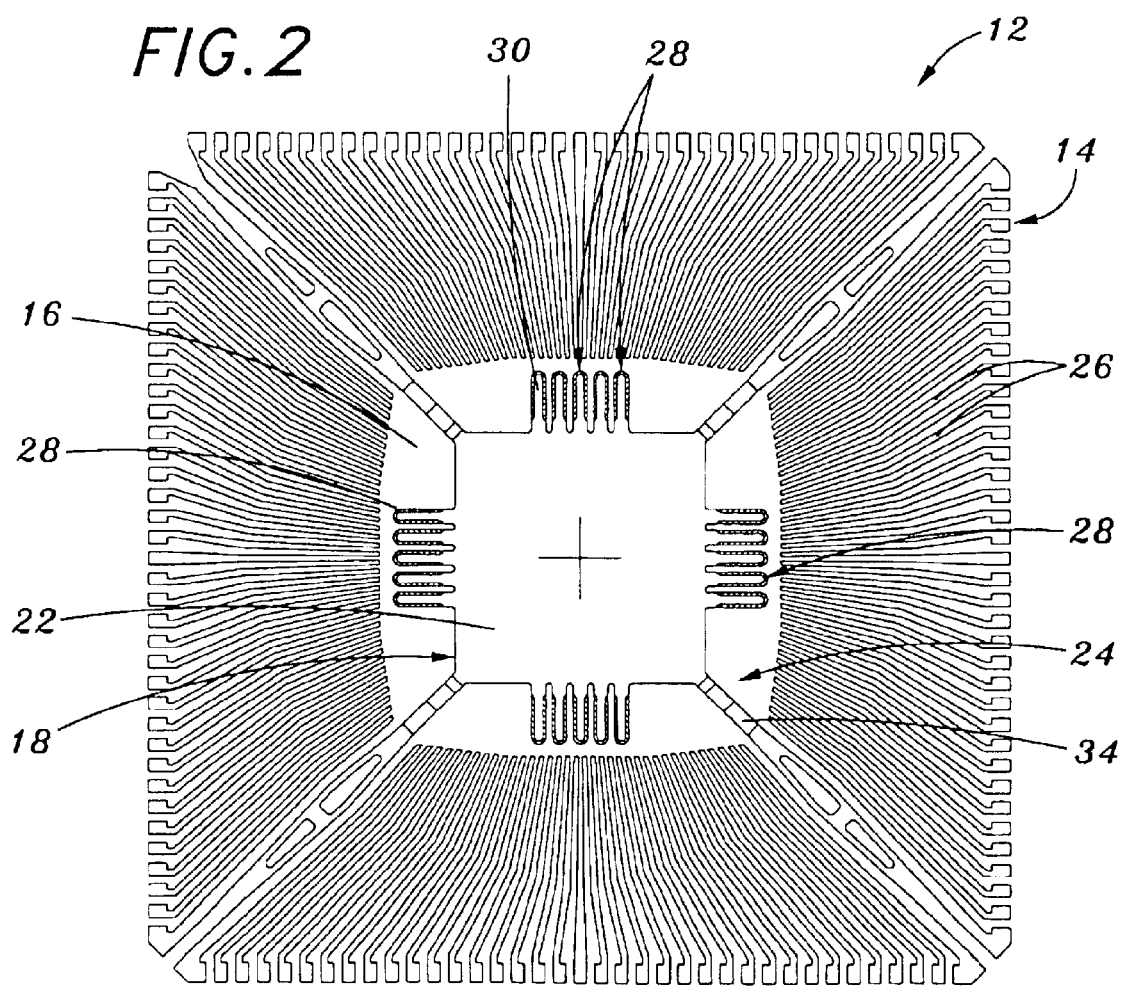

EXPOSED LEAD QFP PACKAGE FABRICATED THROUGH THE USE OF A PARTIAL SAW PROCESS

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates generally to integrated circuit chip package technology, and more particularly to a QFP exposed pad package having exposed leads on the bottom of the package body thereof, and a method of creating such exposed leads in a cost-effective manner.

Integrated circuit dies are conventionally enclosed in plastic packages that provide protection from hostile environments and enable electrical interconnection between the integrated circuit die and an underlying substrate such as a printed circuit board (PCB). The elements of such a package include a metal leadframe, an integrated circuit die, bonding material to attach the integrated circuit die to the leadframe, bond wires which electrically connect pads on the integrated circuit die to individual leads of the leadframe, and a hard plastic encapsulant material which covers the other components and forms the exterior of the package.

The leadframe is the central supporting structure of such a package. A portion of the leadframe is internal to the package, i.e., completely surrounded by the plastic encapsulant. Portions of the leads of the leadframe extend externally from the package or are partially exposed within the encapsulant material for use in electrically connecting the package to another component. In certain semiconductor packages, a portion of the die pad of the leadframe also remains exposed within the exterior of the package for use as a heat sink.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a plurality of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package leadframe. In certain types of QFP packages referred to as QFP exposed pad packages, one surface of the die pad is exposed within the bottom surface of the package body.

There is a current need in the electronics industry for a QFP exposed pad package which includes leads which are exposed within the bottom surface of the package body and are included as an addition to those protruding from the sides of the package body. The present invention provides such a QPF exposed pad package wherein leads exposed within the bottom surface of the package body are provided through the use of standard, low-cost leadframe design techniques. The exposed leads of the present invention are created through utilizing a standard leadframe with additional lead features that are isolated subsequent to a mold process through the use of a partial saw method. These, as well as other features and attributes of the present invention, will be discussed in more detail below.

BRIEF SUMMARY OF THE INVENTION

In accordance with the present invention, there is provided a method of cost-effectively creating high frequency electrical signal I/O paths on the bottom of a quad flat pack (QFP) package without features that would otherwise degrade electrical performance, and the QFP package itself fabricated as a result of the implementation of such methodology. These objectives are satisfied in the present invention through the creation of electrically isolated, exposed leads on the bottom of a QFP package, and more particularly a QFP exposed pad package. More particularly, the exposed leads of the present invention are created through the utilization of a standard leadframe with additional lead features that are isolated subsequent to a mold process through the use of a partial saw method. In this regard, after a certain point in the manufacturing process (i.e., after mold and plating), the exposed leads are electrically isolated from other structures in the leadframe through the completion of a partial saw cut into the molded bottom surface of the package body of the QFP package.

One of the primary benefits of the QFP package of the present invention is that it provides additional I/O or power/ground with very low parasitic inductance due to extremely short wire lengths. This enables very high frequency I/O structures which standard QFP packages are not capable of providing. In addition to the exposed leads being electrically isolated from other standard leads in the QFP package of the present invention, such exposed leads are also formed to be as short as possible. Though an exposed lead could be created by down-setting the lead finger part of a typical lead, such a fabrication technique creates a long antenna structure that seriously degrades electrical performance. By using the above-described partial saw process, this "excess" lead portion can be removed, and the antenna effect removed from the circuit.

In the present invention, the exposed lead structure of the QFP package is connected to other structures in the leadframe to enable processing during manufacturing. In one embodiment, the exposed leads are connected to the die pad of the leadframe to maintain structural integrity during the manufacturing process. The exposed leads of the leadframe are downset with the die pad so they are exposed within the bottom surface of the package body of the QFP package during the package body molding process. After mold and plating, the exposed leads are isolated by partial sawing as indicated above. In another embodiment of the present invention, the exposed leads are connected to other leads or lead fingers of the leadframe to maintain structural integrity during the manufacturing process. Again, the exposed leads are downset so as to be exposed within the bottom surface of the package body of the QFP package during the molding process for the package body. After mold and plating, the exposed leads are again isolated through the implementation of the partial sawing process.

In yet another embodiment, the exposed leads are connected to a ring that may be used for ground connection to the die pad, with the ring being attached to the tie bars of the leadframe. The exposed leads are connected to the ring to maintain structural integrity during the manufacturing process, and are downset so as to be exposed within the bottom surface of the package body of the QFP package during the package body molding process. After mold and plating, the exposed leads are isolated through the implementation of the partial sawing process. In a still further embodiment of the present invention, the exposed leads are connected to the die pad through the use of a connecting bar to hold the exposed leads in place, with the exposed leads further being inset into prescribed areas within the die pad. The exposed leads are downset so as to be exposed within the bottom surface of the package body of the QFP package during the molding process for the package body, with the exposed leads being isolated through the implementation of the partial sawing process after mold and plating. The present invention finds particular utility in relation to QFP packages due to the specific need of low inductance signal pads for these typically large packages, but may also be applied to any gull-wing leaded semiconductor package.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein:

FIG. 1 is a bottom perspective view of a semiconductor package constructed in accordance with a first embodiment of the present invention;

FIG. 2 is a top plan view of the leadframe of the semiconductor package of the first embodiment;

Common reference numerals are used throughout the drawings and detailed description to indicate like elements.

DETAILED DESCRIPTION OF THE INVENTION

Figure 3:
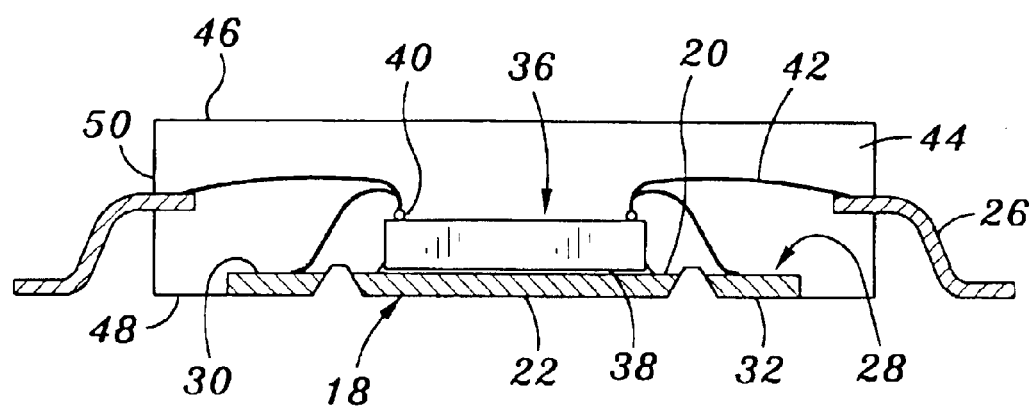
FIG. 3 is a partial cross-sectional view of the semiconductor package of the first embodiment.

Referring now to the drawings wherein the showings are for purposes of illustrating preferred embodiments of the present invention only, and not for purposes of limiting the same, FIG. 1 perspectively illustrates a semiconductor package 10 constructed in accordance with a first embodiment of the present invention. The semiconductor package 10 is a quad flat pack (QFP) package, and more particularly a QFP exposed pad package. Referring now to FIGS. 1–3, used in the fabrication of the semiconductor package 10 is a leadframe 12 which includes an outer frame 14 defining a central opening 16. As shown in FIG. 2, the outer frame 14, and hence the central opening 16, has a generally square shape defining four peripheral sides of substantially equal length. Disposed within the central opening 16 is a die pad 18 of the leadframe 12 which itself has a generally square configuration defining four peripheral edge segments of substantially equal length. The die pad 18 defines a generally planar top surface 20 and an opposed, generally planar bottom surface 22. The die pad 18 is supported within the central opening 16 by four tie bars 24 which are integrally connected to and extend between the outer frame 14 and respective ones of the four corner regions defined by the die pad 18. Those of ordinary skill in the art will recognize that the outer frame 14 and die pad 18 of the leadframe may have alternative shapes, such as a rectangular shape, without departing from the spirit and scope of the present invention.

The leadframe 12 further comprises a plurality of primary leads 26 which are integrally connected to the outer frame 14 and extend inwardly into the central opening 16 toward the die pad 18. The primary leads 26 are segregated into four sets, with each set being integrally connected to a respective one of the four peripheral sides of the outer frame 14 and extending toward a respective one of the four peripheral edge segments defined by the die pad 18. As seen in FIG. 2, each adjacent set of primary leads 26 is separated by one of the tie bars 24. In addition to the primary leads 26, the leadframe 12 includes a plurality of secondary leads 28 which are integrally connected to the die pad 18. More particularly, the secondary leads 28 are also segregated into four sets, with each set being integrally connected to and extending outwardly from a respective one of the four peripheral edge segments of the die pad 18 toward a respective set of the primary leads 26. Each of the secondary leads 28 defines a top surface 30 and an opposed bottom surface 32.

The leadframe 12 is fabricated from a conductive metallic material (e.g., copper) through either a chemical etching or mechanical stamping technique. During the formation of the leadframe 12, each of the secondary leads 28 is half-etched in a manner facilitating the formation of a continuous, recessed shoulder within the bottom surface 32 thereof, such shoulder extending continuously along the inner end and portions of the longitudinal sides of each secondary lead 28. Upon the completion of the etching or stamping process, the leadframe 12 is subjected to a bending operation which effectively downsets the die pad 18 and secondary leads 28 from the inner end portions of the primary leads 26, as shown in FIG. 3. As a result of such bending operation, each of the tie bars 24 includes an angled or sloped portion 34 extending between an inner end portion which is connected to one of the corner regions defined by the die pad 18 and extends in substantially coplanar relation to the die pad 18 and secondary leads 28, and an outer end portion which extends in substantially coplanar relation to the primary leads 26.

In fabricating the semiconductor package 10, upon the die pad 18 and secondary leads 28 being downset in the above-described manner, a semiconductor die 36 is attached to the die pad 18. More particularly, the bottom surface of the semiconductor die 36 is bonded to the top surface 20 of the die pad 18 through the use of a layer 38 of an epoxy or other adhesive. Upon such attachment, pads or terminals 40 disposed on the top surface of the semiconductor die 36 are electrically connected to a primary lead 26 and/or a secondary lead 28 via one or more conductive wires 42 extending therebetween. As seen in FIG. 3, each conductive wire 42 used to electrically connect a terminal 40 to a corresponding secondary lead 28 extends to the top surface 30 of such secondary lead 28.

Subsequent to the mechanical and electrical connection of the semiconductor die 36 to the primary and secondary leads 26, 28 through the use of the conductive wires 42, the leadframe 12 is partially encapsulated or covered with an encapsulant material in a molding process, with the hardening of the encapsulant material resulting in the formation of a package body 44 of the semiconductor package 10. The package body 44 formed as a result of the molding operation defines a generally planar top surface 46, a generally planar bottom surface 48, and four peripheral side surfaces 50. The encapsulant material is applied to the leadframe 12 such that in the completely formed package body 44, the bottom surface 22 of the die pad 18 and bottom surfaces 32 of the secondary leads 28 are exposed within the bottom surface 48 of the package body 44. The package body 44 is further formed such that the inner end portions of the primary leads 26 are encapsulated therein, with the outer end portions of the primary leads 26 protruding from respective ones of the side surfaces 50 of the package body 44.

Referring again to FIG. 1, due to the arrangement of the secondary leads 28 about the die pad 18, the secondary leads 28 are arranged into two spaced, generally parallel rows and two spaced, generally parallel columns. Each row and each column of the secondary leads 28 defines a saw street 52. In fabricating the semiconductor package 10, a saw blade is advanced into the bottom surface 48 of the package body 44 along each of the saw streets 52. As such, the saw blade is also advanced into the bottom surfaces 32 of each of the secondary leads 28. The package body 44 and secondary leads 28 are cut by the saw blade along each saw street 52 to a depth sufficient to effectively separate or electrically isolate each of the secondary leads 28 from the die pad 18, and thus each other. The completion of this partial saw process results in the formation of cut grooves 54 within the package body 44, with the cut grooves 54 extending along respective ones of the saw streets 52.

Subsequent to the completion of the above-described partial saw cut process, the leadframe 12 is singulated so as to facilitate the removal of the outer frame 14 from the tie bars 24 and primary leads 26. Those portions of the tie bars 24 protruding from the package body 44 are also removed. The remaining exposed outer end portions of the primary leads 26 are then subjected to another bending operation to impart gull-wing configurations thereto. In the completed semiconductor package 10, the secondary leads 28 are effectively prevented from accidental separation or dislodgement from within the package body 44 attributable to the mechanical interlock formed by the flow of the encapsulant material into the recessed shoulder of each secondary lead 28.

Figure 4:
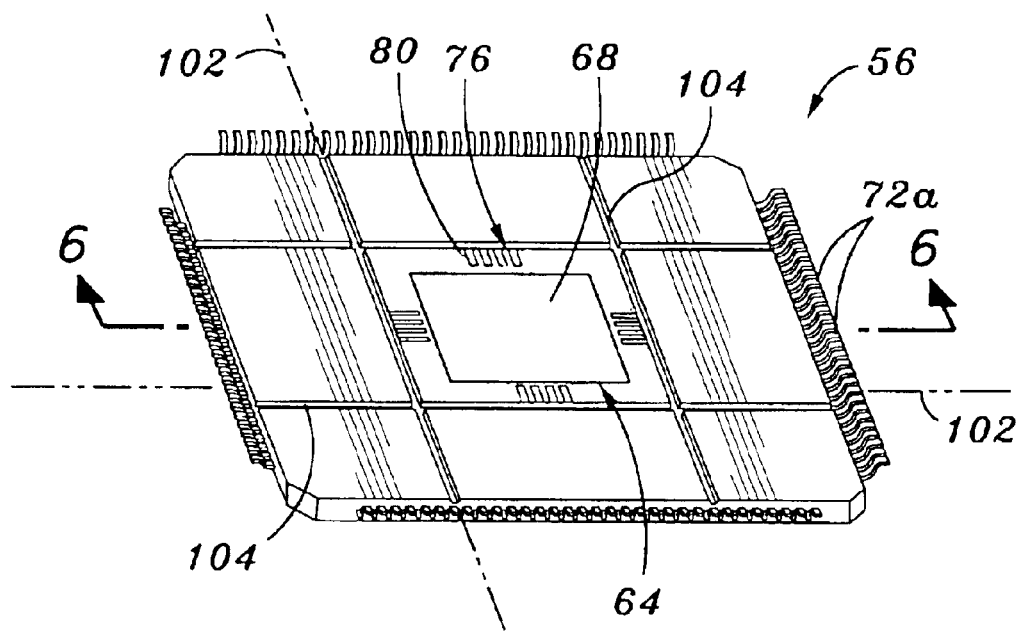
FIG. 4 is a bottom perspective view of a semiconductor package constructed in accordance with a second embodiment of the present invention.
Figure 6:
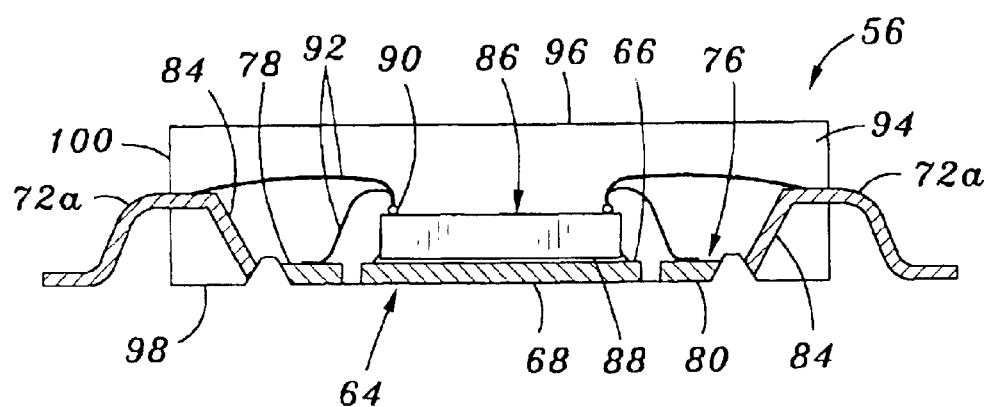
FIG. 6 is a partial cross-sectional view of the semiconductor package of the second embodiment.
Figure 5:
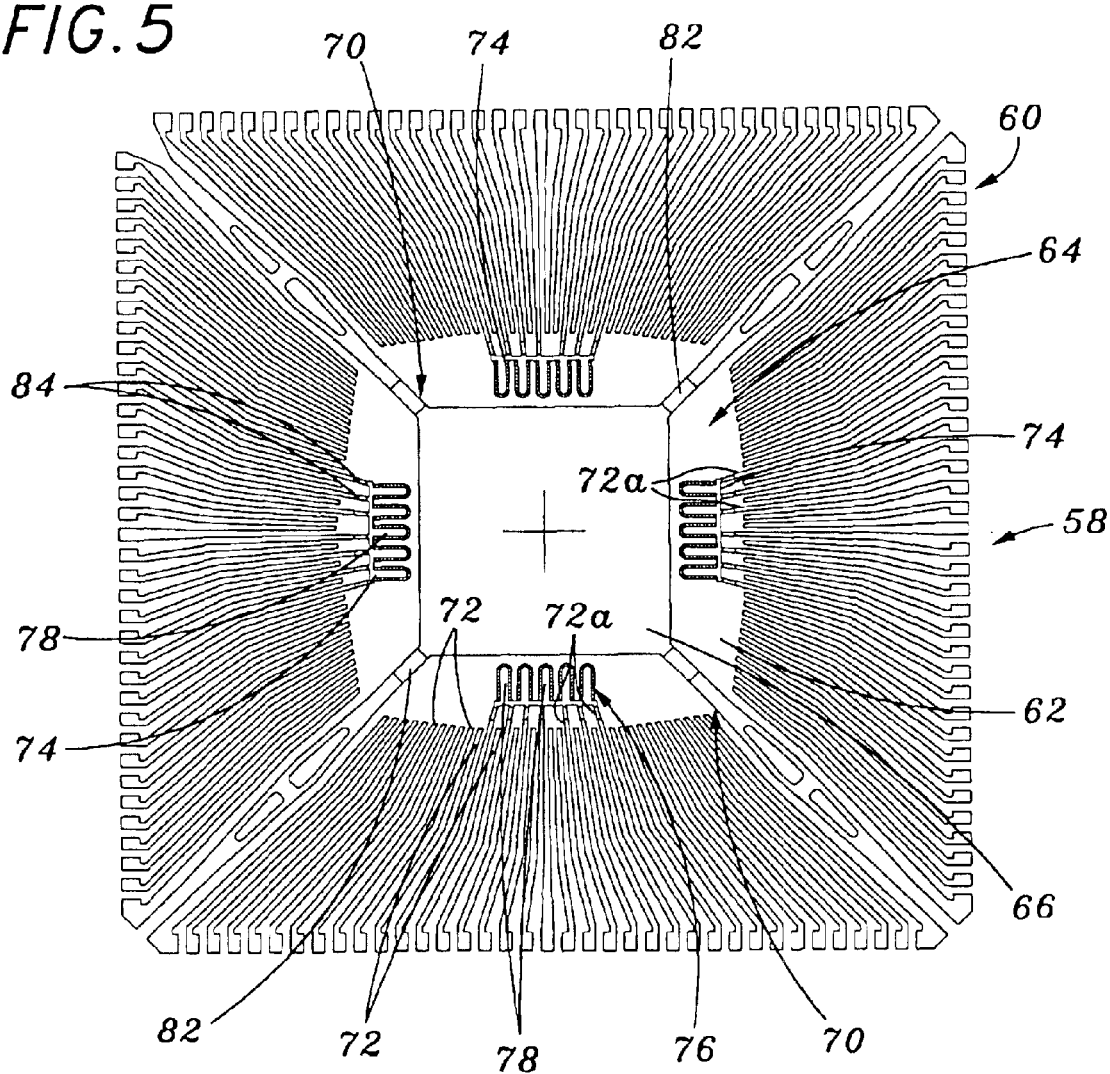
FIG. 5 is a top plan view of the leadframe of the semiconductor package of the second embodiment.

Referring now to FIGS. 4 through 6, there is shown a semiconductor package 56 constructed in accordance with a second embodiment of the present invention. The semiconductor package 56 is also a QFP exposed pad package. Used in the fabrication of the semiconductor package 56 is a leadframe 58 which includes an outer frame 60 defining a central opening 62. As shown in FIG. 5, the outer frame 60, and hence the central opening 62, has a generally square shape defining four peripheral sides of substantially equal length. Disposed within the central opening 62 is a die pad 64 of the leadframe 58 which itself has a generally square configuration defining four peripheral edge segments of substantially equal length. The die pad 64 defines a generally planar top surface 66 and an opposed, generally planar bottom surface 68. The die pad 64 is supported within the central opening 62 by four tie bars 70 which are integrally connected to and extend between the outer frame 60 and respective ones of the four corner regions defined by the die pad 64. As discussed above in relation to the leadframe 12 of the first embodiment, the outer frame 60 and die pad 64 of the leadframe 58 may have other quadrangle shapes other than a square shape.

The leadframe 58 of the second embodiment further comprises a plurality of primary leads 72 which are integrally connected to the outer frame 60 and extend inwardly into the central opening 62 toward the die pad 64. The primary leads 72 are segregated into four sets, with each set being integrally connected to a respective one of the four peripheral sides of the outer frame 60 and extending toward a respective one of the four peripheral edge segments defined by the die pad 64. Each adjacent set of primary leads 72 is separated by one of the tie bars 70. Each set of the primary leads 72 includes a number of primary leads 72a which are of greater length than the remaining primary leads 72 of the same set. As seen in FIG. 5, each set of primary leads 72 includes seven primary leads 72a of greater length, though this number of primary leads 72a is exemplary only. Integrally connected to those ends of the primary leads 72a of each set which are disposed closest to the die pad 64 is a connecting bar 74. Thus, a total of four connecting bars 74 are included in the leadframe 58.

In addition to the primary leads 72, 72a, the leadframe 58 includes a plurality of secondary leads 76 which are integrally connected to the connecting bars 74 and extend toward the die pad 64. More particularly, the secondary leads 76 are also segregated into four sets, with each set being integrally connected to and extending from a respective one of the connecting bars 74 toward a respective one of the four peripheral edge segments of the die pad 64. Each of the secondary leads 76 defines a top surface 78 and an opposed bottom surface 80.

The leadframe 58 is also fabricated from a conductive metallic material (e.g., copper) through either a chemical etching or mechanical stamping technique. As is seen in FIG. 5, during the formation of the leadframe 58, each of the secondary leads 76 is half-etched in a manner facilitating the formation of a continuous, recessed shoulder within the bottom surface 80 thereof, such shoulder extending continuously along the inner end and longitudinal sides of each secondary lead 76 to a respective one of the connecting bars 74. Upon the completion of the etching or stamping process, the leadframe 58 is subjected to a bending operation which effectively downsets the die pad 64, the connecting bars 74 and the secondary leads 76 from the primary leads 72. As a result of such bending operation, each of the tie bars 70 includes an angled or sloped portion 82 extending between an inner end portion which is connected to one of the corner regions defined by the die pad 64 and extends in substantially coplanar relation to the die pad 64 and secondary leads 76, and an outer end portion which extends in substantially co-planar relation to the primary leads 72. The bending operation also results in each of the primary leads 72a of greater length including an angled or sloped portion 84 extending between an inner end portion which is connected to a respective one of the connecting bars 74 and extends in substantially coplanar relation to the die pad 64 and secondary leads 76, and an outer end portion which extends in substantially coplanar relation to the remaining primary leads 72.

In fabricating the semiconductor package 56, upon the die pad 64, connecting bars 74 and secondary leads 76 being downset in the above-described manner, a semiconductor die 86 is attached to the die pad 64. More particularly, the bottom surface of the semiconductor die 86 is bonded to the top surface 66 of the die pad 64 through the use of a layer 88 of an epoxy or other adhesive. Upon such attachment, pads or terminals 90 disposed on the top surface of the semiconductor die 86 are electrically connected to a primary lead 72, 72a and/or a secondary lead 76 via one or more conductive wires 92 extending therebetween. Each conductive wire 92 used to electrically connect a terminal 90 to a corresponding secondary lead 76 extends to the top surface 78 of such secondary lead 76.

Subsequent to the mechanical and electrical connection of the semiconductor die 86 to the primary and secondary leads 72, 72a, 76 through the use of the conductive wires 92, the leadframe 58 is partially encapsulated or covered with an encapsulant material in a molding process, with the hardening of the encapsulant material resulting in the formation of a package body 94 of the semiconductor package 56. The package body 94 formed as a result of the molding operation defines a generally planar top surface 96, a generally planar bottom surface 98, and four peripheral side surfaces 100. The encapsulant material is applied to the leadframe 58 such that in the completely formed package body 94, the bottom surface 68 of the die pad 64, the bottom surfaces of the connecting bars 74, and the bottom surfaces 80 of the secondary leads 76 are exposed within the bottom surface 98 of the package body 94. The package body 94 is further formed such that the inner end portions of the primary leads 72, 72a are encapsulated therein, with the outer end portions of the primary leads 72, 72a protruding from respective ones of the side surfaces 100 of the package body 94.

Due to the arrangement of the secondary leads 76 about the die pad 64, the connecting bars 74 are arranged into two spaced, generally parallel rows and two spaced, generally parallel columns. Each row and column of the connecting bars 74 defines a saw street 102. In fabricating the semiconductor package 56, a saw blade is advanced into the bottom surface 98 of the package body 94 along each of the saw streets 102. As such, the saw blade is also advanced into the bottom surface of each of the connecting bars 74, with the width of the saw blade exceeding the width of each connecting bar 74. The package body 94 and connecting bars 74 are cut by the saw blade along each saw street 102 to a depth sufficient to effectively separate or electrically isolate each of the secondary leads 76 from the primary leads 72a. Such separation/electrical isolation is achieved as a result of the complete removal of the connecting bars 74 effectuated by the partial saw process. The completion of this partial saw process results in the formation of cut grooves 104 within the package body 94, with the cut grooves 104 extending along respective ones of the saw streets 102.

Subsequent to the completion of the above-described partial saw cut process, the leadframe 58 is singulated so as to facilitate the removal of the outer frame 60 from the tie bars 70 and primary leads 72, 72a. Those portions of the tie bars 70 protruding from the package body 94 are also removed. The remaining exposed outer end portions of the primary leads 72, 72a are then subjected to another bending operation to impart gull-wing configurations thereto. In the completed semiconductor package 56, the secondary leads 76 are effectively prevented from accidental separation or dislodgement from within the package body 94 attributable to the mechanical interlock formed by the flow of the encapsulant material into the recessed shoulder of each secondary lead 76.

In the leadframe 58 as is shown in FIG. 5, the connecting bars 74 are included due to the pitch of the primary leads 72, 72a being much less than the pitch of the secondary leads 76. However, if the pitch of the primary leads 72, 72a was approximately the same as the pitch of the secondary leads 76, the secondary leads 76 could simply be integrally connected to respective ones of the primary leads 72a (i.e., comprise extensions of the primary leads 72), with a bending operation being used to downset the secondary leads 76 from the primary leads 72. Thus, in this circumstance, the connecting bars 74 would be eliminated.

Figure 7:
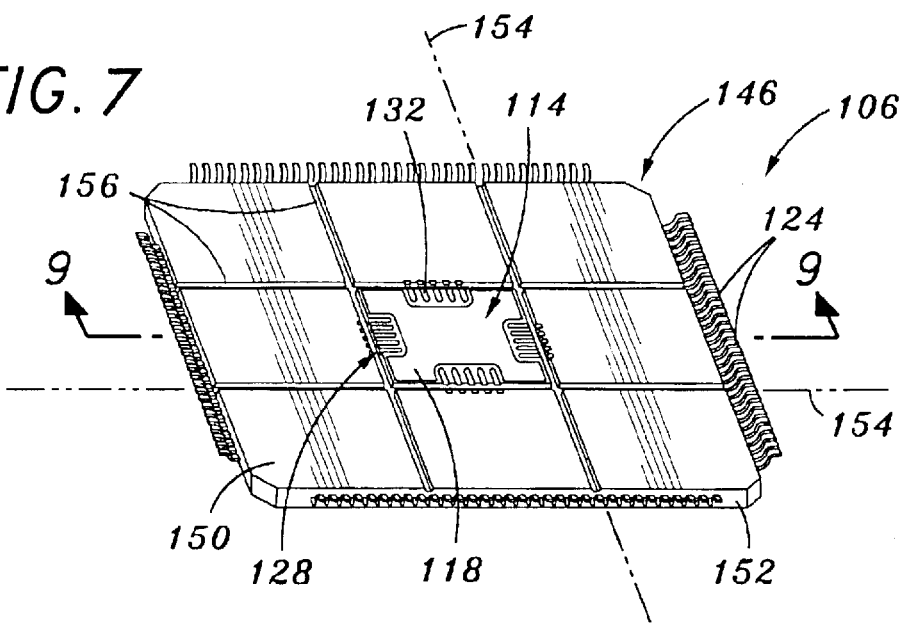
FIG. 7 is a bottom perspective view of a semiconductor package constructed in accordance with a third embodiment of the present invention.
Figure 8:
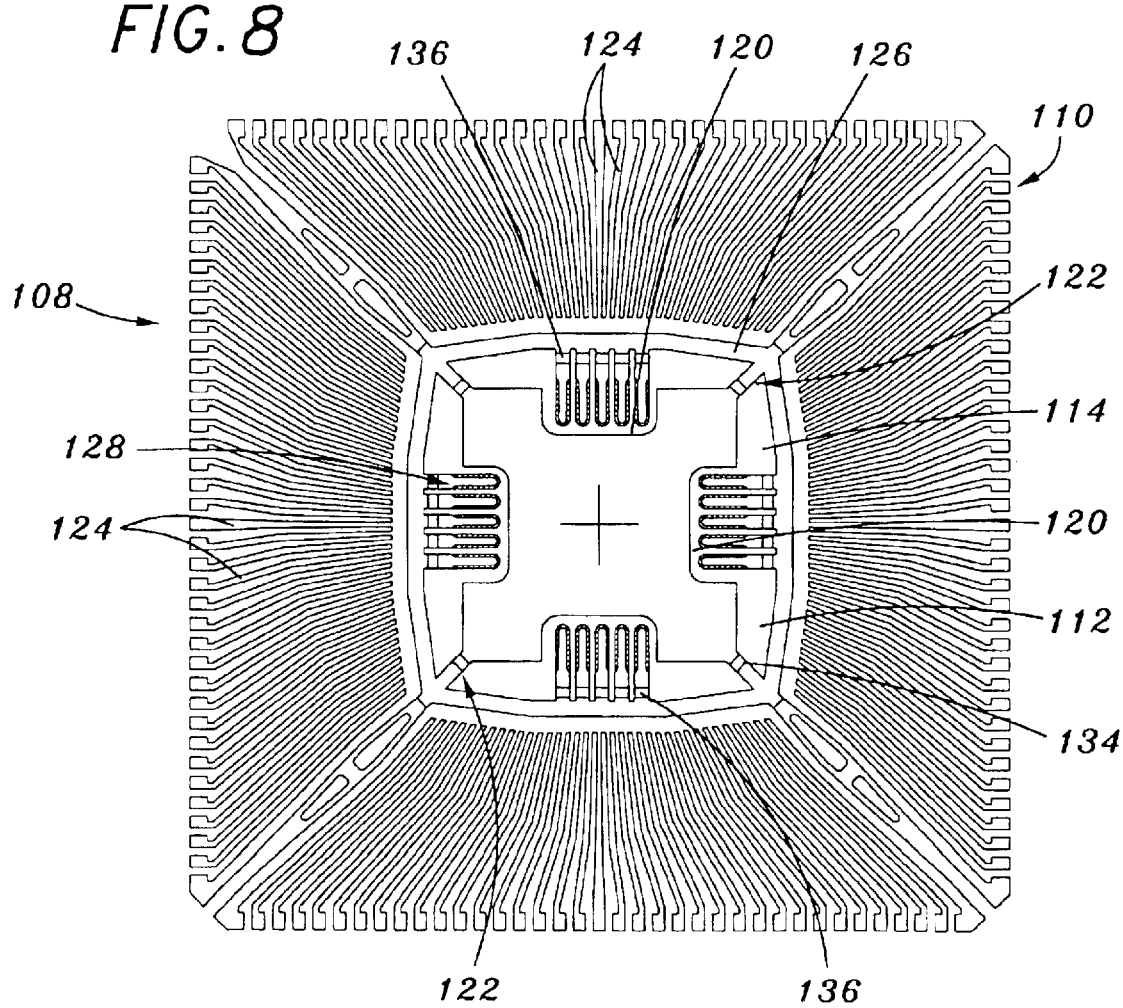
FIG. 8 is a top plan view of the leadframe of the semiconductor package of the third embodiment.
Figure 9:
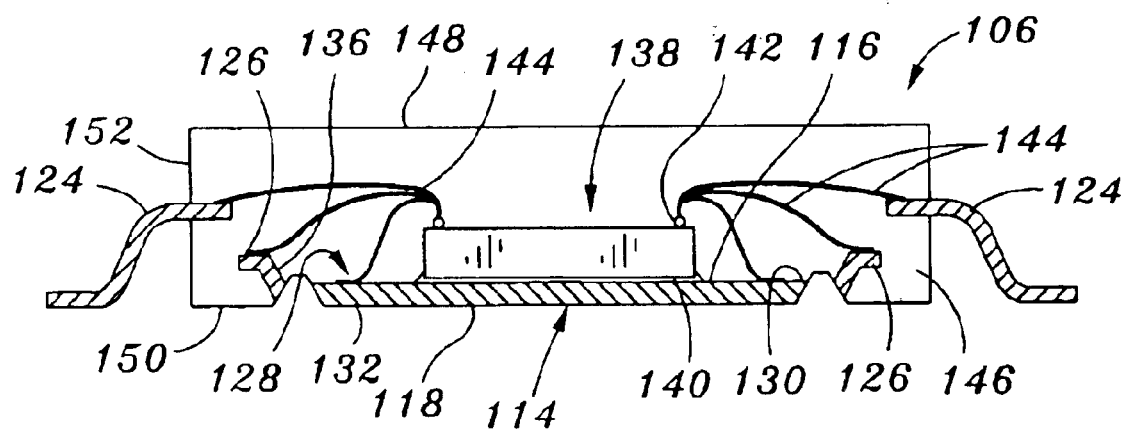
FIG. 9 is a partial cross-sectional view of the semiconductor package of the third embodiment.

Referring now to FIGS. 7–9, there is shown a semiconductor package 106 constructed in accordance with a third embodiment of the present invention. The semiconductor package 106 is also a QFP exposed pad package. Used in the fabrication of the semiconductor package 106 is a leadframe 108 which includes an outer frame 110 defining a central opening 112. As shown in FIG. 8, the outer frame 110, and hence the central opening 112, has a generally square shape defining four peripheral sides of substantially equal length. Disposed within the central opening 112 is a die pad 114 of the leadframe 108. The die pad 114 defines a generally planar top surface 116, an opposed, generally planar bottom surface 118, and four peripheral edge segments which are of substantially equal length and each include a recess 120 formed therein. The die pad 114 is supported within the central opening 112 by four tie bars 122 which are integrally connected to and extend between the outer frame 110 and respective ones of the four corner regions defined by the die pad 114.

The leadframe 108 further comprises a plurality of primary leads 124 which are integrally connected to the outer frame 110 and extend inwardly into the central opening 112 toward the die pad 114. The primary leads 124 are segregated into four sets, with each set being integrally connected to a respective one of the four peripheral sides of the outer frame 110 and extending toward a respective one of the four peripheral edge segments defined by the die pad 114. Each adjacent set of primary leads 124 is separated by one of the tie bars 122. In addition to the primary leads 124, the leadframe 108 includes a continuous ring 126 which is integrally connected to the tie bars 122 and extends about the periphery of the die pad 114 in spaced relation to the peripheral edge segments thereof and in spaced relation to the inner ends of the primary leads 124. Thus, the ring 126 also defines four peripheral sides, with each side extending between one set of the primary leads 124 and a corresponding one of the peripheral edge segments of the die pad 114.

The leadframe 108 of the semiconductor package 106 further comprises a plurality of secondary leads 128 which are integrally connected to the ring 126 and extend inwardly toward the die pad 114. More particularly, the secondary leads 128 are also segregated into four sets, with each set being integrally connected to and extending inwardly from a respective one of the four peripheral sides of the ring 126 and into a respective one of the recesses 120 formed within the die pad 114. Though being received into a respective one of the recesses 120, the secondary leads 128 of each set do not contact the die pad 114. Each of the secondary leads 128 defines a top surface 130 and an opposed bottom surface 132.

The leadframe 108 is fabricated from a conductive metallic material (e.g., copper) through either a chemical etching or mechanical stamping technique. Like the secondary leads 28, 76 described above, the secondary leads 128 of the leadframe 108 are each preferably half-etched so as to facilitate the formation of a recessed shoulder within the bottom surface 132 thereof, such recessed shoulder extending about the inner end and portions of the longitudinal sides of each secondary lead 128. Upon the completion of the etching or stamping process, the leadframe 108 is subjected to a bending operation which effectively downsets the die pad 114 and secondary leads 128 from the primary leads 124 and ring 126. As a result of such bending operation, each of the tie bars 122 includes an angled or sloped portion 134 extending between an inner end portion which is connected to one of the corner regions defined by the die pad 114 and extends in substantially coplanar relation to the die pad 114 and secondary leads 128, and an outer end portion which extends in substantially coplanar relation to the primary leads 124. Similarly, the bending operation results in each of the secondary leads 128 including an angled or sloped portion 136 extending between an outer end portion which is connected to one of the peripheral sides of the ring 126 and an inner end portion which extends in substantially coplanar relation to the die pad 114.

In fabricating the semiconductor package 106, upon the die pad 114 and inner end portions of the secondary leads 128 being downset in the above-described manner, a semiconductor die 138 is attached to the die pad 114. More particularly, the bottom surface of the semiconductor die 138 is bonded to the top surface 116 of the die pad 114 through the use of a layer 140 of an epoxy or other adhesive. The semiconductor die 138 is sized relative to the die pad 114 such that when attached to the top surface 116, the peripheral sides of the semiconductor die 138 only slightly overlap or extend over the recesses 120. Upon such attachment, pads or terminals 142 disposed on the top surface of the semiconductor die 138 are electrically connected to a primary lead 124, the ring 126, or a secondary lead 128 individually or in any combination via one or more conductive wires 144 extending therebetween. Each conductive wire 144 used to electrically connect a terminal 142 to a corresponding secondary lead 128 extends to the top surface 130 of such secondary lead 128.

Subsequent to the mechanical and electrical connection of the semiconductor die 138 to the primary and secondary leads 124, 128 and ring 126 through the use of the conductive wires 144, the leadframe 108 is partially encapsulated or covered with an encapsulant material in a molding process, with the hardening of the encapsulant material resulting in the formation of a package body 146 of the semiconductor package 106. The package body 146 formed as a result of the molding operation defines a generally planar top surface 148, a generally planar bottom surface 150, and four peripheral side surfaces 152. The encapsulant material is applied to the leadframe 108 such that in the completely formed package body 146, the bottom surface 118 of the die pad 114 and the bottom surfaces 132 of the inner end portions of the secondary leads 128 are exposed within the bottom surface 150 of the package body 146. The package body 146 is further formed such that the inner end portions of the primary leads 124, the ring 126, and the outer end portions and slope portions 136 of the secondary leads 128 are encapsulated therein, with the outer end portions of the primary leads 124 protruding from respective ones of the side surfaces 152 of the package body 146.

As seen in FIG. 7, due to the arrangement of the inner end portions of the secondary leads 128 within respective ones of the recesses 120 of the die pad 114, the secondary leads 128 are arranged into two spaced, generally parallel rows and two spaced, generally parallel columns. Each row and column of the secondary leads 128 defines a saw street 154. Each saw street 154 extends along and in close proximity to a respective one of the four peripheral edge segments defined by the die pad 114. In fabricating the semiconductor package 106, a saw blade is advanced into the bottom surface 150 of the package body 146 along each of the saw streets 154. As such, the saw blade is also advanced into sections of the bottom surfaces 132 of the inner end portions of the secondary leads 128 which do not reside within the recesses 120. The package body 146 and inner end portions of the secondary leads 128 are cut by the saw blade along each saw street 154 to a depth sufficient to effectively separate or electrically isolate each of the secondary leads 128 from the ring 126, and thus each other. As seen in FIGS. 7 and 9, the secondary leads 128 are each cut at approximately the junction between the inner end portion and sloped portion 136 thereof. The completion of this partial saw process results in the formation of cut grooves 156 within the package body 146, with the cut grooves 156 extending along respective ones of the saw streets 154.

Upon the completion of the partial saw process, the inner end portions of the secondary leads 128 (the bottom surfaces 132 of which are exposed within the bottom surface 150) are effectively prevented from accidental separation or dislodgement from within the package body 146 attributable to the mechanical interlock formed by the flow of the encapsulant material into the recessed shoulder of each secondary lead 128. As indicated above, the recessed shoulder of each secondary lead 128 is formed via the completion of a half-etch process. In the semiconductor package 106, the configuration of the die pad 114 is adapted to maximize the area of the exposed bottom surface 118 thereof, and hence the thermal performance/heat dissipation characteristics of the die pad 114.

Subsequent to the completion of the above-described partial saw cut process, the leadframe 108 is singulated so as to facilitate the removal of the outer frame 110 from the tie bars 122 and primary leads 124. Those portions of the tie bars 122 protruding from the package body 146 are also removed. The remaining exposed outer end portions of the primary leads 124 are then subjected to another bending operation to impart gull-wing configurations thereto.

Figure 10:
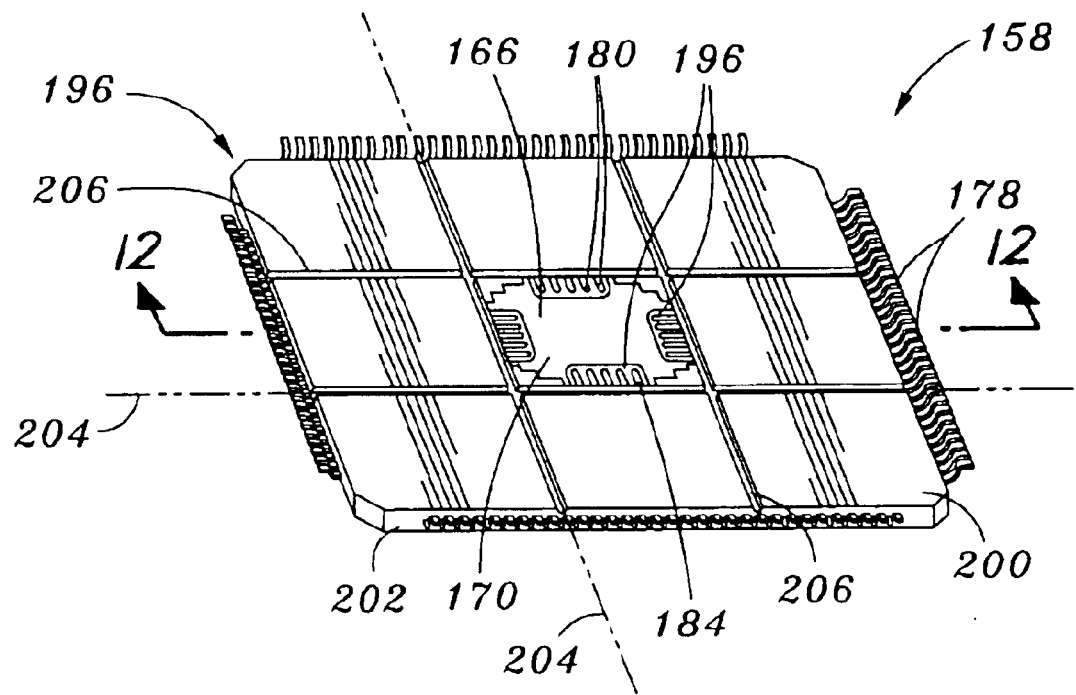
FIG. 10 is a bottom perspective view of a semiconductor package constructed in accordance with a fourth embodiment of the present invention.
Figure 12:
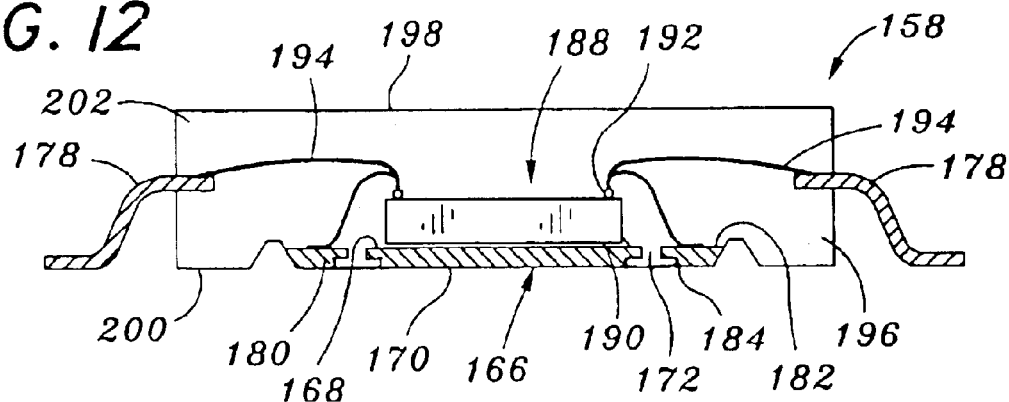
FIG. 12 is a partial cross-sectional view of the semiconductor package of the fourth embodiment.
Figure 11:
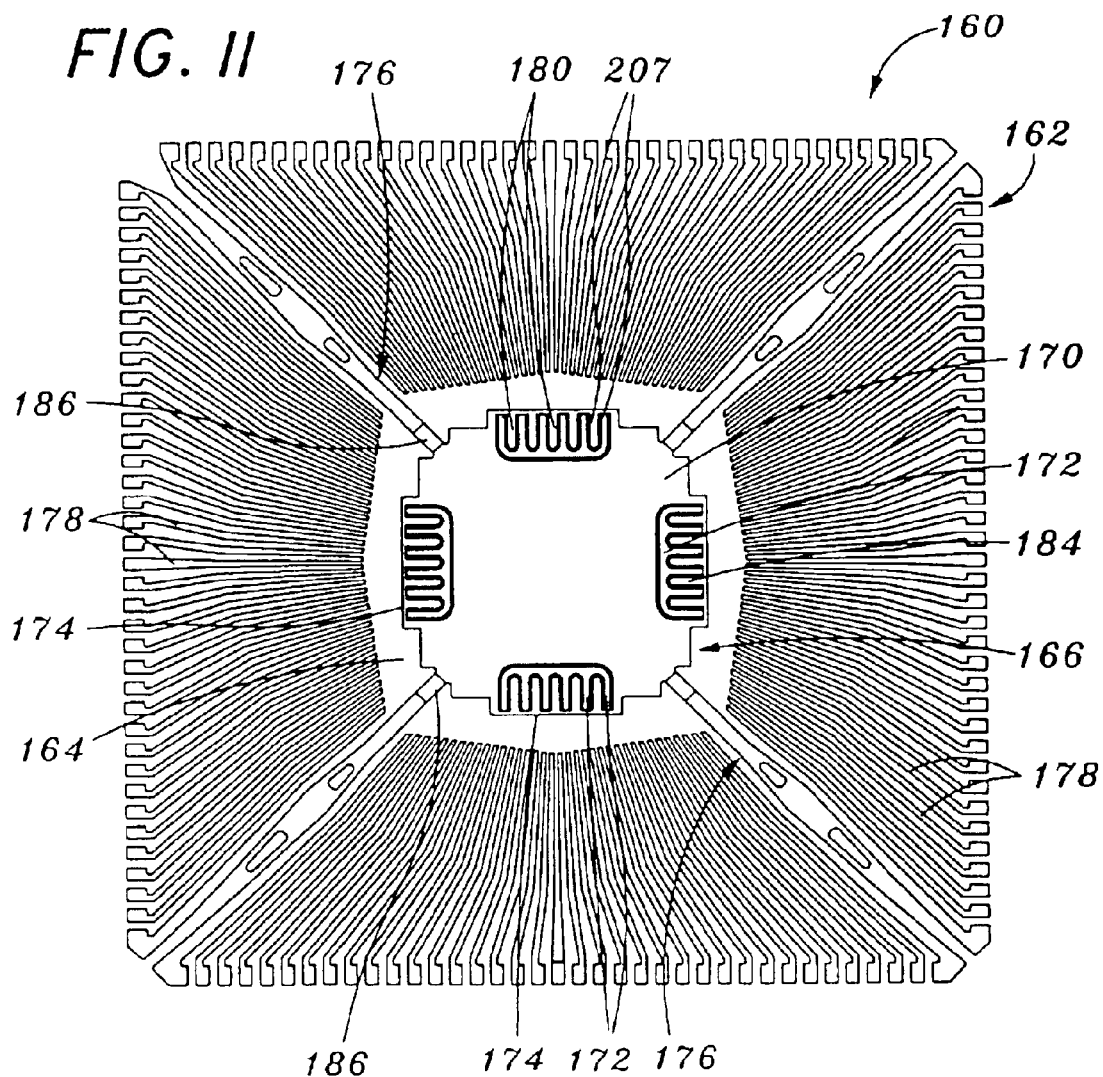
FIG. 11 is a bottom plan view of the leadframe of the semiconductor package of the fourth embodiment.

Referring now to FIGS. 10–12, there is shown a semiconductor package 158 constructed in accordance with a fourth embodiment of the present invention. The semiconductor package 158 is also a QFP exposed pad package. Used in the fabrication of the semiconductor package 158 is a leadframe 160 which includes an outer frame 162 defining a central opening 164. As shown in FIG. 11, the outer frame 162, and hence the central opening 164, has a generally square shape defining four peripheral sides of substantially equal length. Disposed within the central opening 164 is a die pad 166 of the leadframe 160. The die pad 166 defines a generally planar top surface 168, an opposed, generally planar bottom surface 170, and four peripheral edge segments. Disposed within the die pad 166 are four slots 172 which extend along respective ones of the four peripheral edge segments of the die pad 166. Each of the slots 172 is partially defined by a respective one of four connecting bar portions 174 of the die pad 166. A total of four connecting bar portions 174 are included in the die pad 166, with each connecting bar portion 174 also partially defining one of the four peripheral edge segments of the die pad 166. The die pad 166 is supported within the central opening 164 by four tie bars 176 which are integrally connected to and extend between the outer frame 162 and respective ones of the four corner regions defined by the die pad 166. As seen in FIG. 11, the corner regions of the die pad 166 are inset, thus resulting in portions of the tie bars 176 being inset into the die pad 166 for reasons which will be described in more detail below.

The leadframe 160 further comprises a plurality of primary leads 178 which are integrally connected to the outer frame 162 and extend inwardly into the central opening 164 toward the die pad 166. The primary leads 178 are segregated into four sets, with each set being integrally connected to a respective one of the four peripheral sides of the outer frame 162 and extending toward a respective one of the four peripheral edge segments defined by the die pad 166. Each adjacent set of primary leads 178 is separated by one of the tie bars 176.

The leadframe 160 of the semiconductor package 158 further comprises a plurality of secondary leads 180. The secondary leads 180 are also segregated into four sets, with each set being integrally connected to a respective one of the connecting bar portions 174 and extending inwardly within a respective one of the slots 172 formed within the die pad 166. Each of the secondary leads 180 defines a top surface 182 and an opposed bottom surface 184.

The leadframe 160 is fabricated from a conductive metallic material (e.g., copper) through either a chemical etching or mechanical stamping technique. The secondary leads 180 of the leadframe 160 are each preferably half-etched so as to facilitate the formation of a recessed shoulder within the bottom surface 184 thereof, such recessed shoulder extending about the inner end and longitudinal sides of each secondary lead 180 to a respective one of the connecting bar portions 174. Upon the completion of the etching or stamping process, the leadframe 160 is subjected to a bending operation which effectively downsets the die pad 166 and secondary leads 180 from the primary leads 178. As a result of such bending operation, each of the tie bars 176 includes an angled or sloped portion 186 extending between an inner end portion which is connected to one of the inset corner regions defined by the die pad 166 and extends in substantially coplanar relation to the die pad 166 and secondary leads 180, and an outer end portion which extends in substantially coplanar relation to the primary leads 178.

In fabricating the semiconductor package 158, upon the die pad 166 and secondary leads 180 being downset in the above-described manner, a semiconductor die 188 is bonded to the top surface 168 of the die pad 166 through the use of a layer 190 of an epoxy or other adhesive. The semiconductor die 188 is sized relative to the die pad 166 such that when attached to the top surface 168, the peripheral sides of the semiconductor die 188 only slightly overlap or extend over the slots 172. Upon such attachment, pads or terminals 192 disposed on the top surface of the semiconductor die 188 are electrically connected to a primary lead 178 and/or a secondary lead 180 via one or more conductive wires 194 extending therebetween. Each conductive wire 194 used to electrically connect a terminal 192 to a corresponding secondary lead 180 extends to the top surface 182 of such secondary lead 180.

Subsequent to the mechanical and electrical connection of the semiconductor die 188 to the primary and secondary leads 178, 180 through the use of the conductive wires 194, the leadframe 160 is partially encapsulated or covered with an encapsulant material in a molding process, with the hardening of the encapsulant material resulting in the formation of a package body 196 of the semiconductor package 158. The package body 196 formed as a result of the molding operation defines a generally planar top surface 198, a generally planar bottom surface 200, and four peripheral side surfaces 202. The encapsulant material is applied to the leadframe 160 such that in the completely formed package body 196, the bottom surface 170 of the die pad 166, the bottom surfaces of the connecting bar portions 174, and the bottom surfaces 184 of the secondary leads 180 are exposed within the bottom surface 200 of the package body 196. The package body 196 is further formed such that the inner end portions of the primary leads 178 are encapsulated therein, with the outer end portions of the primary leads 178 protruding from respective ones of the side surfaces 202 of the package body 196.

As seen in FIG. 10, due to the configuration of the die pad 166, the connecting bar portions 174 defined thereby are arranged into two spaced, generally parallel rows and two spaced, generally parallel columns. Each row and column of the connecting bar portions 174 defines a saw street 204. In fabricating the semiconductor package 158, a saw blade is advanced into the bottom surface 200 of the package body 196 along each of the saw streets 204. As such, the saw blade is also advanced into the bottom surface of each of the connecting bar portions 174, with the width of the saw blade exceeding the width of each connecting bar portion 174. The package body 196 and connecting bar portions 174 are cut by the saw blade along each saw street 204 to a depth sufficient to effectively separate or electrically isolate each of the secondary leads 180 from the die pad 166, and hence each other. Such separation/electrical isolation is achieved as a result of the complete removal of the connecting bar portions 174 effectuated by the partial saw process. It is noted that once the connecting bar portions 174 are removed, the slot 172 may also be referred to as a recess. The completion of this partial saw process results in the formation of cut grooves 206 within the package body 196, with the cut grooves 206 extending along respective ones of the saw streets 204. The inset of the inner end portions of the tie bars 176 into the corner regions of the die pad 166 coupled with the downset of such inner end portions from the outer end portions of the tie bars 176 effectively prevents the cutting of the tie bars 176 since the inner end portions thereof clear the path of the saw blade. Since the tie bars 176 are not cut, they may be used as a ground path within the completed semiconductor package 158.

Upon completion of the partial saw process, the secondary leads 180 are effectively prevented from accidental separation or dislodgement from within the package body 196 attributable to the mechanical interlock formed by the flow of the encapsulant material into the recessed shoulder 207 of each secondary lead 180. In the semiconductor package 158, the configuration of the die pad 166 is adapted to maximize the area of the exposed bottom surface 170 thereof, and hence the thermal performance/heat dissipation characteristics of the die pad 166.

Subsequent to the completion of the above-described partial saw process, the leadframe 160 is singulated so as to facilitate the removal of the outer frame 162 from the tie bars 176 and primary leads 178. Those portions of the tie bars 176 protruding from the package body 196 are also removed. The remaining exposed outer end portions of the primary leads 178 are then subjected to another bending operation to impart gull-wing configurations thereto.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure. For example, in each embodiment of the semiconductor package of the present invention, the bottom surface of the die pad may be embedded within the package body, rather than being exposed within the bottom surface thereof. Moreover, though the present invention finds particular utility in relation to QFP packages, it may also be applied to any gull-wing leaded semiconductor package, such as a TSOP package. Additionally, in all four embodiments of the semiconductor package described above, the exposed portions of the bottom surfaces of the secondary leads are located on the bottom surface of the package body such that the secondary leads and primary leads are on the same plane, thus providing for easy solder attachment to a common printed circuit board surface. However, there is nothing preventing the exposed secondary leads from being located within the top surface of the package body, which could be achieved using standard methods of inverted package construction. This would allow a second semiconductor package to be physically and electrically attached to the top of an underlying semiconductor package through the use of the exposed secondary leads.

What is claimed is:

1. A semiconductor package comprising:
   a die pad;
   a semiconductor die attached to the die pad;
   a plurality of primary leads extending at least partially about the die pad in spaced relation thereto, each of the primary leads defining an outer end portion;
   a plurality of secondary leads extending along the die pad in spaced relation thereto and toward certain ones of the primary leads, each of the secondary leads defining a bottom surface;
   at least two conductive wires electrically connected to and extending between the semiconductor die and respective ones of the primary and secondary leads; and
   a package body at least partially encapsulating the die pad, the primary leads, the secondary leads, the semiconductor die, and the conductive wires such that the outer end portions of the primary leads protrude from the package body and the bottom surfaces of the secondary leads are exposed within the package body.

2. The semiconductor package of claim 1 wherein the outer end portion of each of the primary leads has a gull-wing configuration.

3. The semiconductor package of claim 1 wherein:
   the package body defines four side surfaces and a bottom surface;
   the outer end portions of the primary leads protrude from respective ones of the four side surfaces defined by the package body; and
   the bottom surfaces of the secondary leads are exposed within the bottom surface of the package body.

4. The semiconductor package of claim 3 wherein:
   the die pad defines opposed top and bottom surfaces;
   the semiconductor die is attached to the top surface of the die pad; and
   the bottom surface of the die pad is exposed within the bottom surface of the package body.

5. A semiconductor package comprising:
   a die pad defining four peripheral edge segments which each include a recess formed therein;
   a semiconductor die attached to the die pad;
   a plurality of primary leads extending at least partially about the die pad in spaced relation thereto, each of the primary leads defining an outer end portion;
   a plurality of secondary leads disposed between the primary leads and the die pad and extending into respective ones of the recesses defined by the die pad, each of the secondary leads defining a bottom surface;
   at least two conductive wires electrically connected to and extending between the semiconductor die and respective ones of the primary and secondary leads; and
   a package body at least partially encapsulating the die pad, the primary leads, the secondary leads, the semiconductor die, and the conductive wires such that the outer end portions of the primary leads protrude from the package body and the bottom surfaces of the secondary leads are exposed within the package body.

6. The semiconductor package of claim 5 wherein the outer end portion of each of the primary leads has a gull-wing configuration.

7. The semiconductor package of claim 5 wherein:
   the package body defines four side surfaces and a bottom surface;
   the outer end portions of the primary leads protrude from respective ones of the four side surfaces of the package body; and
   the bottom surfaces of the secondary leads are exposed within the bottom surface of the package body.

8. The semiconductor package of claim 7 wherein:
   the die pad defines opposed top and bottom surfaces;
   the semiconductor die is attached to the top surface of the die pad; and
   the bottom surface of the die pad is exposed within the bottom surface of the package body.

9. A semiconductor package comprising:
   a die pad;
   a semiconductor die attached to the die pad;
   a plurality of primary leads extending at least partially about the die pad in spaced relation thereto, each of the primary leads defining an inner end and an outer end portion;
   a plurality of secondary leads extending along the die pad in spaced relation thereto and toward certain ones of the primary leads, each of the secondary leads defining an outer end and a bottom surface;
   at least two conductive wires electrically connected to and extending between the semiconductor die and respective ones of the primary and secondary leads; and
   a package body defining a side surface and a bottom surface, the package body at least partially encapsulating the die pad, the primary leads, the secondary leads, the semiconductor die, and the conductive wires such that the outer end portions of the primary leads protrude from the side surface of the package body and the bottom surfaces of the secondary leads are exposed within the bottom surface of the package body, the bottom surface of the package body including a groove formed therein which extends between the primary and secondary leads.

10. The semiconductor package of claim 9 wherein the inner ends of the primary leads and the outer ends of the secondary leads extend to and communicate with the groove.

11. The semiconductor package of claim 9 wherein the outer end portion of each of the primary leads has a gull-wing configuration.

12. The semiconductor package of claim 9 wherein:

the die pad defines opposed top and bottom surfaces;

the semiconductor die is attached to the top surface of the die pad; and the bottom surface of the die pad is exposed in the bottom surface of the package body.

13. The semiconductor package of claim 9 wherein:

the die pad has a quadrangular configuration defining at least four peripheral edge segments;

the primary leads are segregated into four sets which extend along and in spaced relation to respective ones of the four peripheral edge segments of the die pad;

the secondary leads are segregated into four sets which extend along and in spaced relation to respective ones of the four peripheral edge segments of the die pad; and the groove defines at least four groove segments which extend between respective ones of the four peripheral edge segments of the die pad and respective ones of the four sets of the secondary leads.

14. The semiconductor package of claim 13 wherein the groove segments each extend to the side surface of the package body.

15. A semiconductor package comprising:

a die pad defining at least four peripheral edge segments which each include a recess formed therein;

a semiconductor die attached to the die pad;

a plurality of primary leads extending at least partially about the die pad in spaced relation thereto, each of the primary leads defining an outer end portion;

a plurality of secondary leads extending into respective ones of the recesses, each of the secondary leads defining an outer end and a bottom surface;

at least two conductive wires electrically connected to and extending between the semiconductor die and respective ones of the primary and secondary leads; and a package body defining a side surface and a bottom surface, the package body at least partially encapsulating the die pad, the primary leads, the secondary leads, the semiconductor die, and the conductive wires such that the outer end portions of the primary leads protrude from the side surface of the package body and the bottom surfaces of the secondary leads are exposed in the bottom surface of the package body, the bottom surface of the package body including a groove formed therein which extends between the primary and secondary leads.

16. The semiconductor package of claim 15 wherein the outer end of each of the secondary leads extends to and communicates with the groove.

17. The semiconductor package of claim 15 wherein the outer end portion of each of the primary leads has a gull-wing configuration.

18. The semiconductor package of claim 15 wherein:

the die pad defines opposed top and bottom surfaces;

the semiconductor die is attached to the top surface of the die pad; and the bottom surface of the die pad is exposed in the bottom surface of the package body.

19. The semiconductor package of claim 15 wherein:

the primary leads are segregated into four sets which extend along and in spaced relation to respective ones of the four peripheral edge segments of the die pad;

the secondary leads are segregated into four sets which extend into respective ones of the recesses; and the groove defines at least four groove segments which extend between respective ones of the four peripheral edge segments of the die pad and respective ones of the four sets of the primary leads.

20. The semiconductor package of claim 9 wherein the groove segments each extend to the side surface of the package body.

21. A semiconductor package comprising:

a die pad defining four peripheral edge segments which each include a recess formed therein;

a plurality of primary leads extending at least partially about the die pad in spaced relation thereto, each of the primary leads defining an outer end portion;

a plurality of secondary leads disposed between the primary leads and the die pad and extending into respective ones of the recesses defined by the die pad, each of the secondary leads defining a bottom surface;

a semiconductor die attached to the die pad and electrically connected to at least one of the primary leads and at least one of the secondary leads; and a package body at least partially encapsulating the die pad, the primary leads, the secondary leads, and the semiconductor die such that the outer end portions of the primary leads protrude from the package body and the bottom surfaces of the secondary leads are exposed in the package body.

22. The semiconductor package of claim 21 wherein the outer end portion of each of the primary leads has a gull-wing configuration.

23. The semiconductor package of claim 21 wherein:

the package body defines four side surfaces and a bottom surface;

the outer end portions of the primary leads protrude from respective ones of the four side surfaces of the package body; and the bottom surfaces of the secondary leads are exposed in the bottom surface of the package body.

24. The semiconductor package of claim 23 wherein:

the die pad defines opposed top and bottom surfaces;

the semiconductor die is attached to the top surface of the die pad; and the bottom surface of the die pad is exposed in the bottom surface of the package body.

25. A semiconductor package comprising:

a die pad defining at least four peripheral edge segments which each include a recess formed therein;

a plurality of primary leads extending at least partially about the die pad in spaced relation thereto, each of the primary leads defining an outer end portion;

a plurality of secondary leads extending into respective ones of the recesses, each of the secondary leads defining an outer end and a bottom surface;

a semiconductor die attached to the die pad and electrically connected to at least one of the primary leads and at least one of the secondary leads; and a package body defining a side surface and a bottom surface, the package body at least partially encapsulating the die pad, the primary leads, the secondary leads, and the semiconductor die such that the outer end portions of the primary leads protrude from the side surface of the package body and the bottom surfaces of the secondary leads are exposed in the bottom surface of the package body, the bottom surface of the package body including a groove formed therein which extends between the primary and secondary leads.

26. The semiconductor package of claim 25 wherein the outer end of each of the secondary leads extends to and communicates with the groove.

27. The semiconductor package of claim 25 wherein the outer end portion of each of the primary leads has a gull-wing configuration.

28. The semiconductor package of claim 25 wherein:
the die pad defines opposed top and bottom surfaces;
the semiconductor die is attached to the top surface of the die pad; and
the bottom surface of the die pad is exposed in the bottom surface of the package body.

29. The semiconductor package of claim 25 wherein:
the primary leads are segregated into four sets which extend along and in spaced relation to respective ones of the four peripheral edge segments of the die pad;
the secondary leads are segregated into four sets which extend into respective ones of the recesses; and
the groove defines at least four groove segments which extend between respective ones of the four peripheral edge segments of the die pad and respective ones of the four sets of the primary leads.

30. The semiconductor package of claim 29 wherein the groove segments each extend to the side surface of the package body.

* * * * *